US011615992B2

(12) United States Patent
Miller et al.

(10) Patent No.: US 11,615,992 B2
(45) Date of Patent: Mar. 28, 2023

(54) SUBSTRATE ISOLATED VTFET DEVICES

(71) Applicant: INTERNATIONAL BUSINESS MACHINES CORPORATION, Armonk, NY (US)

(72) Inventors: Eric Miller, Watervliet, NY (US); Marc A. Bergendahl, Rensselaer, NY (US); Kangguo Cheng, Schenectady, NY (US); John Sporre, Albany, NY (US); Gauri Karve, Cohoes, NY (US); Fee Li Lie, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 3 days.

(21) Appl. No.: 16/743,922

(22) Filed: Jan. 15, 2020

(65) Prior Publication Data

US 2021/0217669 A1     Jul. 15, 2021

(51) Int. Cl.
*H01L 21/84* (2006.01)
*H01L 21/8238* (2006.01)
(Continued)

(52) U.S. Cl.
CPC .... *H01L 21/845* (2013.01); *H01L 21/823821* (2013.01); *H01L 29/66666* (2013.01);
(Continued)

(58) Field of Classification Search
CPC ............ H01L 21/845; H01L 29/78642; H01L 29/66795; H01L 29/66666; H01L 29/785; H01L 21/82382
(Continued)

(56) References Cited

U.S. PATENT DOCUMENTS 5,312,782 A    5/1994  Miyazawa
5,581,101 A   12/1996  Ning et al.
(Continued)

FOREIGN PATENT DOCUMENTS

DE   196 05 109 A1   12/1996
DE   102 13 545 A1   10/2003
EP     0487 083 A2    5/1992

OTHER PUBLICATIONS

Yakimets et al., "Vertical GAAFETs for the Ultimate CMOS Scaling", IEEE Transactions on Electron Devices, May 2015, pp. 1433-1439, vol. 62, No. 5.

*Primary Examiner* — Mohammad M Hoque
(74) *Attorney, Agent, or Firm* — Tutunjian & Bitetto, P.C.; Samuel Waldbaum

(57) ABSTRACT

A method of forming vertical transport field effect transistor (VTFET) devices is provided. The method includes forming a plurality of vertical fins on an upper insulating layer of a dual insulator layer semiconductor-on-insulator (SeOI) substrate, and forming two masking blocks on the plurality of vertical fins, wherein a portion of a protective layer and a fin template on each of the plurality of vertical fins is exposed between the two masking blocks. The method further includes removing a portion of the upper insulating layer between the two masking blocks to form a first cavity beneath the plurality of vertical fins, and forming a first bottom source/drain in the first cavity below the plurality of vertical fins. The method further includes replacing the two masking blocks with a masking layer patterned to have two mask openings above portions of the upper insulating layer adjacent to the first bottom source/drain.

14 Claims, 12 Drawing Sheets

(51) Int. Cl.
  *H01L 29/66* (2006.01)
  *H01L 29/78* (2006.01)
  *H01L 29/786* (2006.01)

(52) U.S. Cl.
  CPC ...... *H01L 29/66795* (2013.01); *H01L 29/785* (2013.01); *H01L 29/78642* (2013.01)

(58) Field of Classification Search
  USPC .......................................................... 257/351
  See application file for complete search history.

(56) References Cited

U.S. PATENT DOCUMENTS

| | | | |
|---|---|---|---|
| 5,777,329 A | 7/1998 | Westphal et al. | |
| 6,406,962 B1 | 6/2002 | Agnello et al. | |
| 6,921,700 B2 | 7/2005 | Orlowski et al. | |
| 7,112,832 B2 | 9/2006 | Orlowski et al. | |
| 7,250,346 B2 | 7/2007 | Chun et al. | |
| 7,439,568 B2 | 10/2008 | Cheng et al. | |
| 7,683,428 B2 | 3/2010 | Chidambarrao et al. | |
| 7,759,188 B2 | 7/2010 | Cheng et al. | |
| 8,343,826 B2 | 1/2013 | Hersee et al. | |
| 8,963,228 B2 | 2/2015 | Chou et al. | |
| 9,431,305 B1* | 8/2016 | Anderson | H01L 29/78696 |
| 9,496,281 B2 | 11/2016 | Doris et al. | |
| 9,780,088 B1* | 10/2017 | Balakrishnan | H01L 29/78696 |
| 9,882,025 B1* | 1/2018 | Zhang | H01L 29/7827 |
| 9,899,489 B2* | 2/2018 | Chang | B82Y 10/00 |
| 9,899,515 B1* | 2/2018 | Cheng | H01L 27/088 |
| 9,935,018 B1* | 4/2018 | Xie | H01L 21/823885 |
| 9,941,394 B2* | 4/2018 | Tsai | H01L 29/42376 |
| 9,966,456 B1* | 5/2018 | Park | H01L 21/823487 |
| 9,972,700 B2 | 5/2018 | Cheng et al. | |
| 10,014,370 B1* | 7/2018 | Xie | H01L 29/66666 |
| 10,090,385 B1* | 10/2018 | Jacob | H01L 21/324 |
| 10,176,997 B1* | 1/2019 | De Silva | H01L 27/0922 |
| 10,297,507 B2 | 5/2019 | Cheng et al. | |
| 10,418,484 B1* | 9/2019 | Xie | H01L 21/8232 |
| 10,461,173 B1* | 10/2019 | Jacob | H01L 21/823487 |
| 2005/0285175 A1 | 12/2005 | Cheng et al. | |
| 2006/0049826 A1 | 3/2006 | Daneman et al. | |
| 2012/0319201 A1* | 12/2012 | Sun | H01L 29/7827 257/338 |
| 2016/0240626 A1* | 8/2016 | Chang | H01L 21/823807 |
| 2017/0179259 A1 | 6/2017 | Anderson et al. | |
| 2017/0301776 A1* | 10/2017 | Zhang | H01L 29/6653 |
| 2017/0358497 A1* | 12/2017 | Cheng | H01L 21/823481 |
| 2018/0004791 A1 | 1/2018 | Lie et al. | |
| 2018/0005896 A1* | 1/2018 | Mallela | H01L 21/823468 |
| 2018/0005904 A1* | 1/2018 | Lee | H01L 29/7827 |
| 2018/0053848 A1 | 2/2018 | Balakrishnan et al. | |
| 2018/0096992 A1 | 4/2018 | Bi et al. | |
| 2018/0226417 A1* | 8/2018 | Ando | H01L 29/0649 |
| 2019/0393342 A1* | 12/2019 | Xie | H01L 29/66666 |

* cited by examiner

SUBSTRATE ISOLATED VTFET DEVICES

BACKGROUND

The present invention generally relates to complementary metal-oxide-silicon (CMOS) devices, and more particularly to isolated vertical transport field effect transistor CMOS.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are coupled together.

SUMMARY

In accordance with an embodiment of the present invention, a method of forming vertical transport field effect transistor (VTFET) devices is provided. The method includes forming a plurality of vertical fins on an upper insulating layer of a dual insulator layer semiconductor-on-insulator (SeOI) substrate, and forming two masking blocks on the plurality of vertical fins, wherein a portion of a protective layer and a fin template on each of the plurality of vertical fins is exposed between the two masking blocks. The method further includes removing a portion of the upper insulating layer between the two masking blocks to form a first cavity beneath the plurality of vertical fins, and forming a first bottom source/drain in the first cavity below the plurality of vertical fins. The method further includes replacing the two masking blocks with a masking layer patterned to have two mask openings above portions of the upper insulating layer adjacent to the first bottom source/drain.

In accordance with another embodiment of the present invention, a method of forming vertical transport field effect transistor (VTFET) devices is provided. The method includes forming a plurality of vertical fins on an upper insulating layer of a dual insulator layer semiconductor-on-insulator (SeOI) substrate. The method further includes forming two masking blocks on the plurality of vertical fins, wherein a portion of a protective layer and a fin template on each of the plurality of vertical fins is exposed between the two masking blocks. The method further includes removing a portion of the upper insulating layer between the two masking blocks to form a first cavity beneath the plurality of vertical fins. The method further includes forming a first bottom source/drain in the first cavity below the plurality of vertical fins, wherein the first bottom source/drain is n-doped or p-doped. The method further includes replacing the two masking blocks with a masking layer patterned to have two mask openings above portions of the upper insulating layer adjacent to the first bottom source/drain, and removing additional portions of the upper insulating layer below the two mask openings to form second and third cavities. The method further includes forming a second bottom source/drain in the second cavity and a third bottom source/drain in the third cavity, wherein the second bottom source/drain and third bottom source/drain have the opposite doping from the first bottom source/drain.

In accordance with yet another embodiment of the present invention, a vertical transport field effect transistor (VTFET) devices is provided. The VTFET includes a plurality of fin segments, wherein at least one fin segment is on a first bottom source/drain region, at least one fin segment is on a second bottom source/drain region, and at least one fin segment is on a third bottom source/drain region, wherein the first bottom source/drain region is n-doped or p-doped and the second bottom source/drain region and third bottom source/drain region have the opposite doping from the first bottom source/drain region. The VTFET further includes a first intervening portion of an upper insulator layer is between the first bottom source/drain region and the second bottom source/drain region, and a second intervening portion of an upper insulator layer is between the first bottom source/drain region and the third bottom source/drain region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a method of fabricating isolated vertical transport field effect transistor (VTFET) complementary metal-oxide-silicon (CMOS) devices. A dual insulator semiconductor-on-insulator (SeOI) substrate can be used to provide electrical isolation of the devices from the bulk substrate and between bottom source/drain regions. N-doped and p-doped bottom source/drain regions can be formed separately in one of the dual insulator layers of the SeOI substrate.

Embodiments of the present invention include replacing two masking blocks with a masking layer patterned to have two mask openings above portions of the upper insulating layer adjacent to the first bottom source/drain, and removing additional portions of the upper insulating layer below the two mask openings to form second and third cavities. The method further includes forming a second bottom source/drain in the second cavity and a third bottom source/drain in the third cavity, wherein the second bottom source/drain and third bottom source/drain have the opposite doping from the first bottom source/drain.

Embodiments of the present invention provide a VTFET having bottom source/drain regions with defined volumes electrically isolated from each other. Portions of the source/drain can be removed by etching and filled back in with dielectric isolation material to separate different devices of the same polarity.

Embodiments of the present invention provide electrically isolated vertical transport field effect transistor (VTFET) complementary metal-oxide-silicon (CMOS) devices utilizing electrically isolated n-doped and p-doped bottom source/drain regions.

Exemplary applications/uses to which the present invention can be applied include, but are not limited to: logic devices (e.g., NAND gates, NOR gates, XOR, gates) memory devices (e.g., static random access memory (SRAM), dynamic random access memory (DRAM)), and application specific integrated circuits (ASICs).

It is to be understood that aspects of the present invention will be described in terms of a given illustrative architecture; however, other architectures, structures, substrate materials and process features and steps can be varied within the scope of aspects of the present invention.

Figure 1:
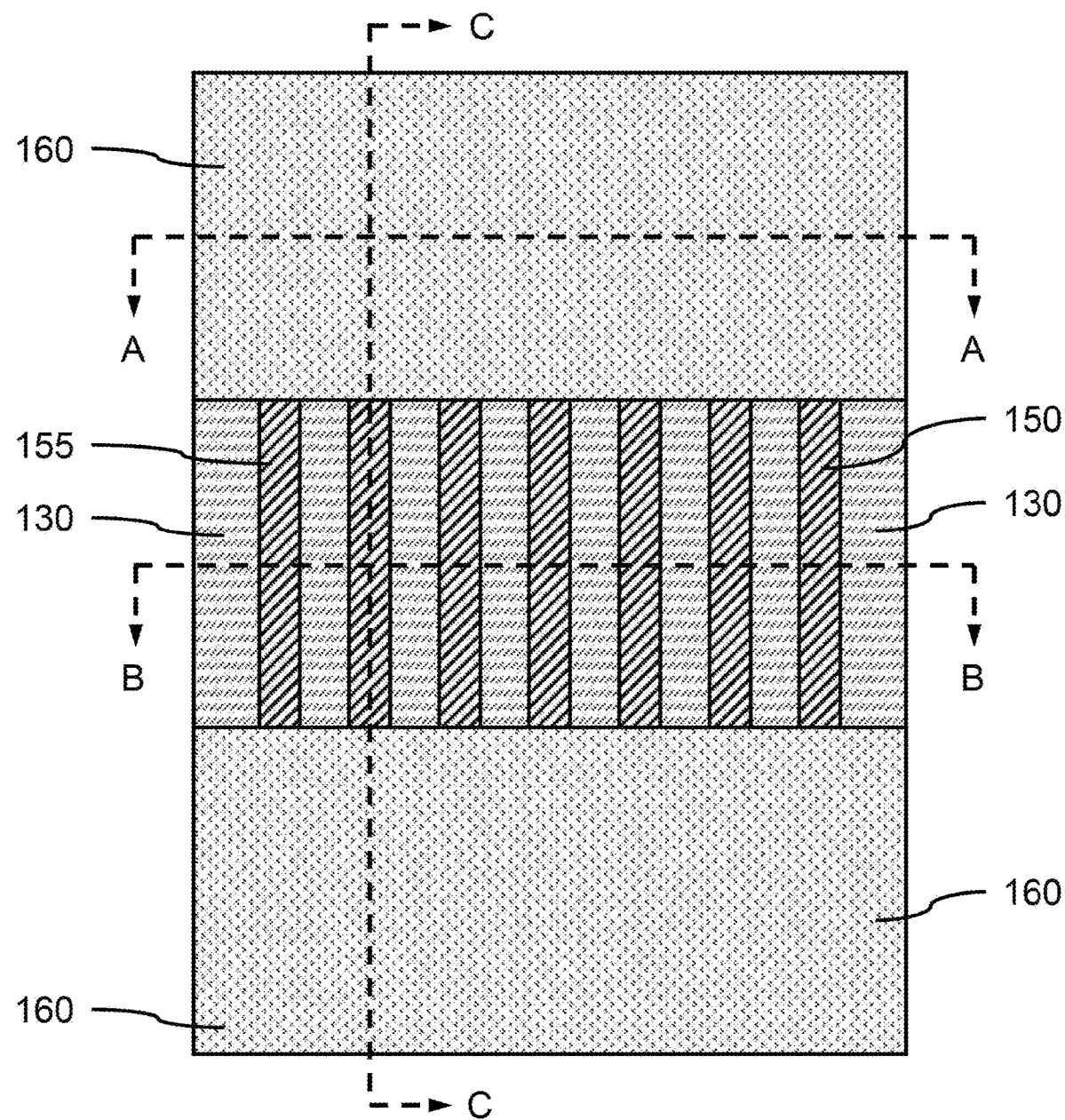
FIG. 1 is a top view showing a protective layer on a plurality of vertical fins, and masking blocks on opposite ends of the vertical fins, in accordance with an embodiment of the present invention.

Referring now to the drawings in which like numerals represent the same or similar elements and initially to FIG. 1, a top view of a protective layer on a plurality of vertical fins, and masking blocks on opposite ends of the vertical fins is shown, in accordance with an embodiment of the present invention.

In one or more embodiments, a plurality of vertical fins can be formed on a substrate, where the substrate can be a dual insulator semiconductor-on-insulator (SeOI) substrate, including a semiconductor active layer, two insulator layers each of a different electrically insulating material, and a carrier layer that provides mechanical support.

In various embodiments, the plurality of vertical fins can be formed by a sidewall image transfer (SIT) process, for example, self-aligned double patterning (SADP) or self-aligned quadruple patterning (SAQP). The plurality of vertical fins can be formed from the semiconductor active layer, such that the vertical fins extend down to the upper insulating layer 130 of the dual insulator layers. The plurality of vertical fins can be essentially parallel, and separated by a distance.

In one or more embodiments, masking blocks 160 can be formed on predetermined portions of the plurality of vertical fins. The masking blocks 160 can be formed by blanket depositing a masking layer on the vertical fins and patterning the masking layer using lithographic techniques and etching. In various embodiments, the plurality of vertical fins can be covered by a protective layer 150. A portion of the masking layer can be removed to expose a portion of the protective layer 150 and fin templates 155 on the vertical fins between the two masking blocks 160. The upper insulating layer 130 can be exposed between adjacent vertical fins.

In various embodiments, the masking blocks 160 can be formed of an organic planarization layer (OPL) material, or other organic material that can be spun onto the surface.

FIG. 1 also identifies cross-sections referenced in the subsequent FIGS. 2-20. The cross-section referenced identifies the direction of view, and does not imply that all features shown in FIGS. 2-20 are illustrated in FIG. 1.

Figure 2:
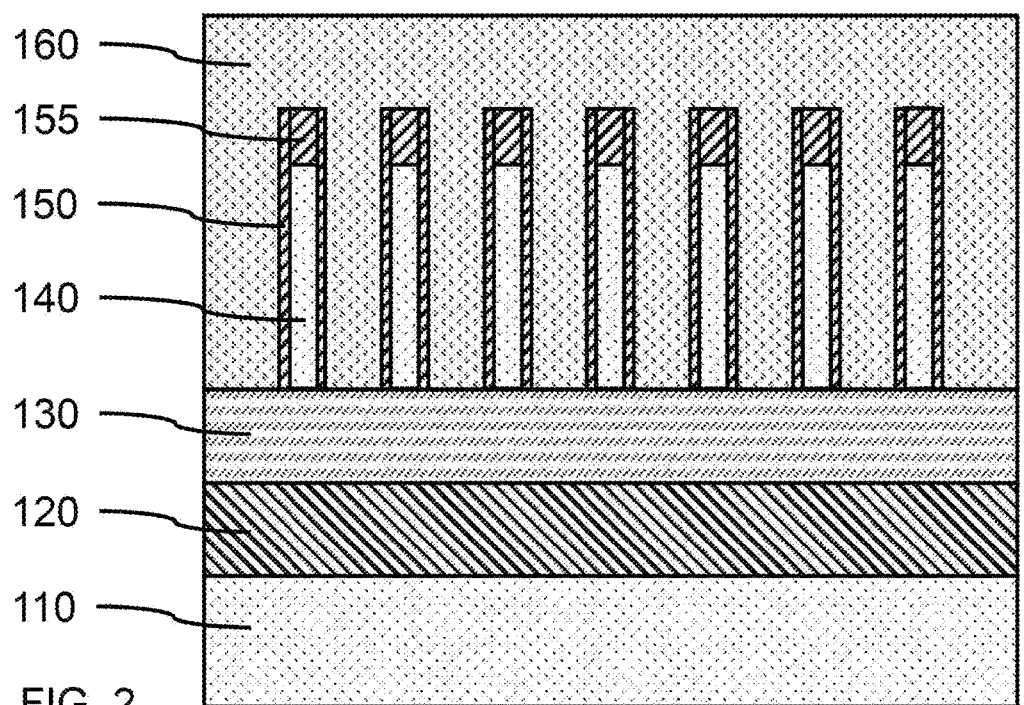
FIG. 2 is a cross-sectional side view along the A-A view identified in FIG. 1 showing a plurality of vertical fins on a substrate with a protective layer over the vertical fins and a masking block on the vertical fins, in accordance with an embodiment of the present invention.

FIG. 2 is a cross-sectional side view along the A-A view identified in FIG. 1 showing a plurality of vertical fins on a substrate with a protective layer over the vertical fins and a masking block on the vertical fins, in accordance with an embodiment of the present invention.

In one or more embodiments, a plurality of vertical fins 140 can be formed on a substrate, where the substrate can be a dual insulator semiconductor-on-insulator (SeOI) substrate, including a semiconductor active layer used to form the vertical fins 140, an upper insulator layer 130, a lower insulator layer 120, and a carrier layer 110 that provides mechanical support.

In various embodiments, the semiconductor active layer can be a group IV semiconductor (e.g., silicon (Si), germanium (Ge)), a group IV compound semiconductor (e.g., silicon-germanium (SiGe), silicon carbide (SiC)), a group III-V compound semiconductor (e.g., gallium arsenide (GaAs), gallium nitride (GaN), indium, phosphide (InP)), and combinations thereof.

In various embodiments, the upper insulator layer 130 can be an insulating dielectric material, including, but not limited to, silicon oxide (SiO) or silicon nitride (SiN). In various embodiments, the lower insulator layer 120 can be an insulating dielectric material, including, but not limited to, silicon oxide (SiO) or silicon nitride (SiN), where the lower insulator layer 120 is a different insulating dielectric material from the upper insulator layer 130.

The carrier layer 110 can be a bulk semiconductor wafer, for example, silicon (Si), silicon-germanium (SiGe), silicon carbide (SiC), where the semiconductor material can be single crystal, polycrystalline, microcrystalline, amorphous, or a combination thereof.

In various embodiments, a protective layer 150 can be formed on the vertical fins 140, where the protective layer 150 can be formed by forming fin templates 155 on a substrate and etching down into the substrate to produce one or more vertical fins, and conformally depositing the protective layer 150 over the vertical fin(s) 140 and the fin template(s) 155 remaining on each of the fins. The fin template(s) 155 and protective layer 150 can be the same hardmask material, where the protective layer 150 can be an insulating dielectric material, including, but not limited to, silicon oxide (SiO), silicon nitride (SiN), silicon oxynitride (SiON), silicon carbonitride (SiCN), silicon boronitride (SiBN), silicon boro carbonitride (SiBCN), and combinations thereof, where the protective layer 150 can be selectively etched relative to the upper insulator layer 130. A directional etch (e.g., RIE) can be used to remove the portion of the conformally deposited protective layer 150 from the substrate surface and top surfaces of the fin templates 155, while the protective layer 150 remains on the sidewalls of the vertical fins 140 and fin template(s) 155.

Figure 3:
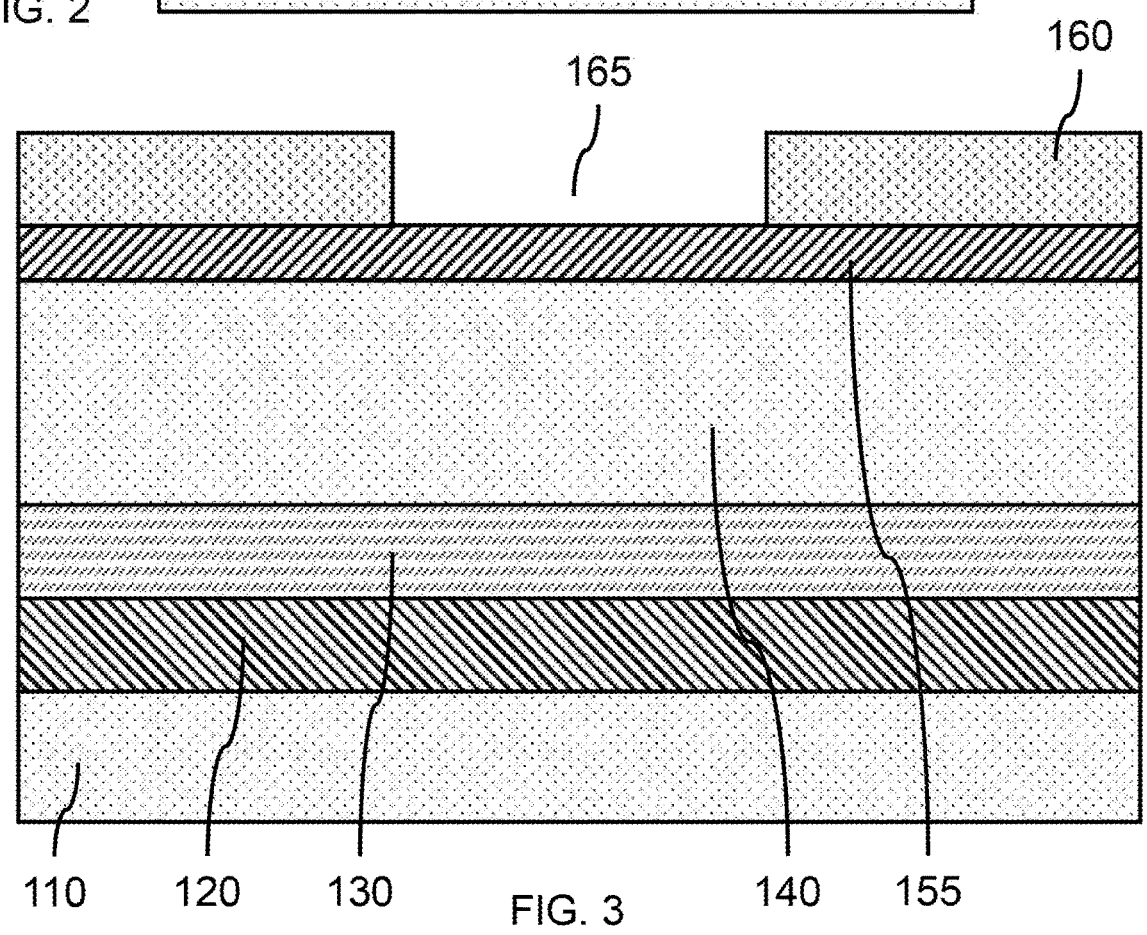
FIG. 3 is a cross-sectional side view along the C-C view identified in FIG. 1 showing a plurality of vertical fins on a substrate with a protective layer over the vertical fins and a masking block on opposite ends of the vertical fins, in accordance with an embodiment of the present invention.

FIG. 3 is a cross-sectional side view along the C-C view identified in FIG. 1 showing a vertical fin on a substrate with a protective layer over the vertical fins and a masking block on opposite ends of the vertical fins, in accordance with an embodiment of the present invention.

In one or more embodiments, a portion of the protective layer 150 can be exposed by an opening 165 between the masking blocks 160. The opening can expose the sidewalls of the protective layer 150 on the vertical fin(s) 140 and a portion of the upper insulator layer 130 between the vertical fins 140.

Figure 4:
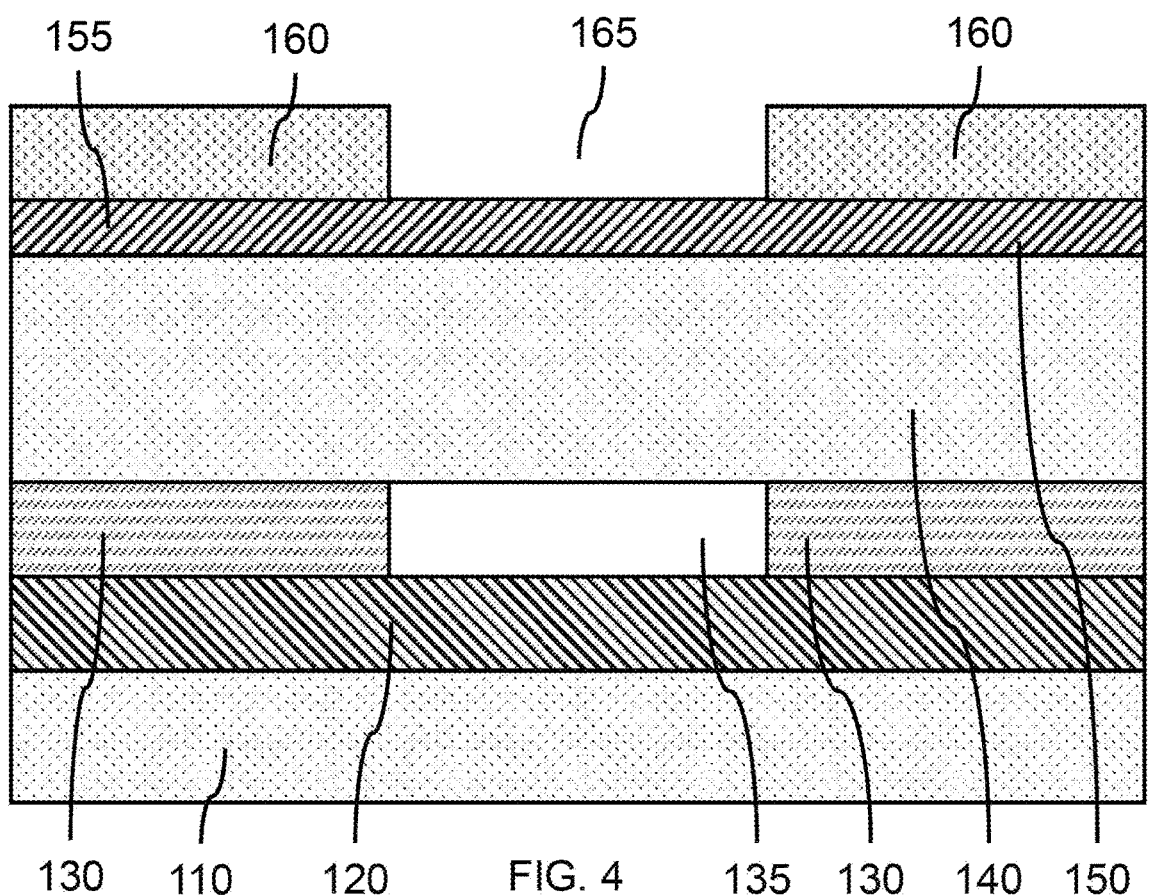
FIG. 4 is a cross-sectional side view along the C-C view identified in FIG. 1 showing a portion of the substrate removed to form a cavity below each of the plurality of vertical fins on a substrate between the masking blocks, in accordance with an embodiment of the present invention.

FIG. 4 is a cross-sectional side view along the C-C view identified in FIG. 1 showing a portion of the substrate removed to form a cavity below each of the plurality of vertical fins on a substrate between the masking blocks, in accordance with an embodiment of the present invention.

In one or more embodiments, a portion of the upper insulator layer 130 can be removed using a selective isotropic etch (e.g., wet chemical etch or dry plasma etch) to form a cavity 135 below each of the plurality of vertical fins 140. The exposed portion of the upper insulator layer 130 between the vertical fins 140 can be removed by the selective isotropic etch and undercut the upper insulator layer 130 below the vertical fins 140. In various embodiments, a plurality of cavities 135 can be formed perpendicular to the vertical fins 140.

Figure 5:
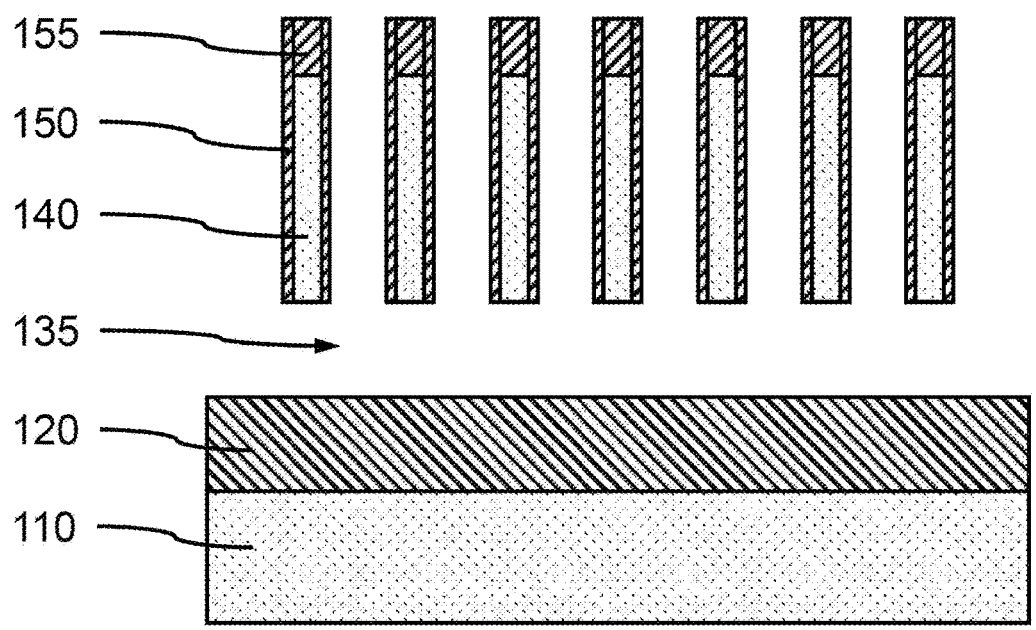
FIG. 5 is a cross-sectional side view along the B-B view identified in FIG. 1 showing the plurality of vertical fins cantilevered over the cavity formed by removing a portion of the upper insulator layer, in accordance with an embodiment of the present invention.

FIG. 5 is a cross-sectional side view along the B-B view identified in FIG. 1 showing the plurality of vertical fins cantilevered over the cavity formed by removing a portion of the upper insulator layer, in accordance with an embodiment of the present invention.

In one or more embodiments, the portions of the vertical fins 140 above the cavity can be supported by the portions of the upper insulator layer 130 on opposite sides of the cavity 135. The vertical fins 140 can span the cavity 135 or plurality of cavities.

Figure 6:
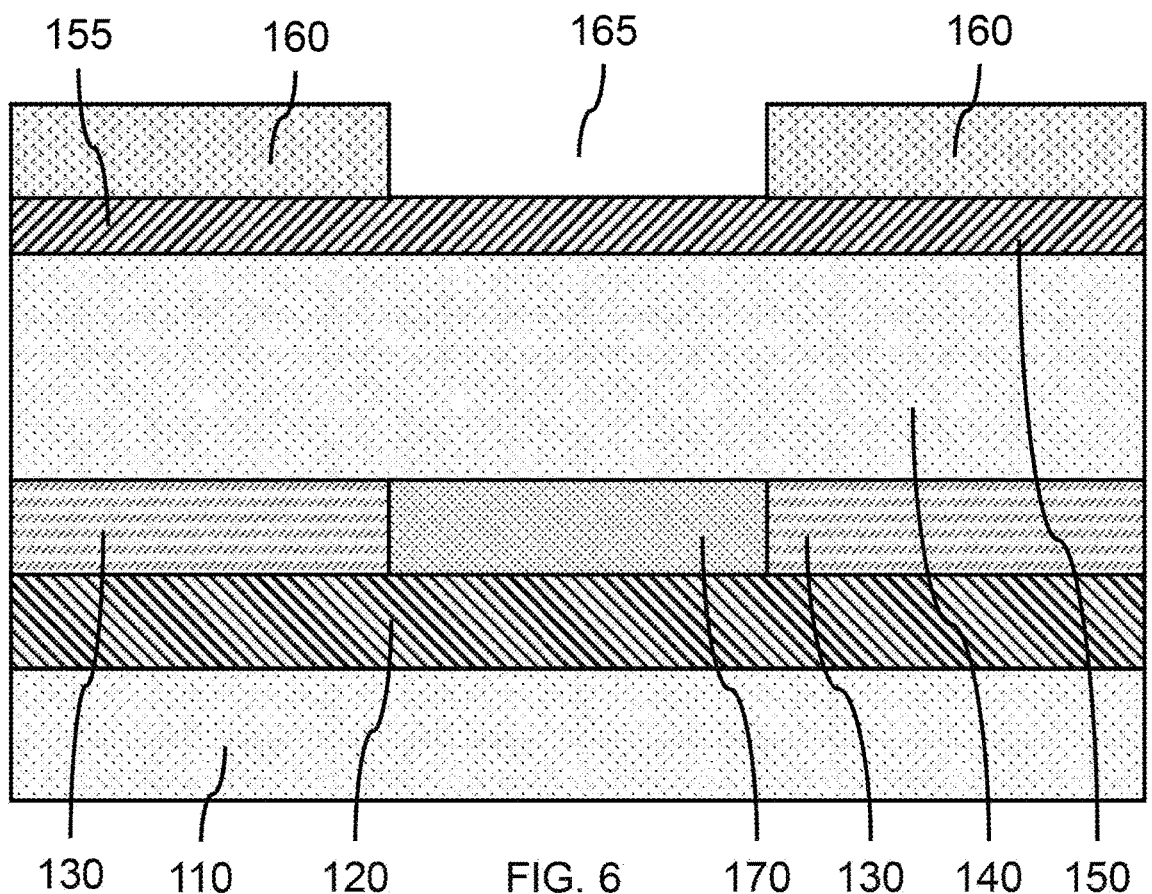
FIG. 6 is a cross-sectional side view along the C-C view identified in FIG. 1 showing a bottom source/drain formed in the cavity below the plurality of vertical fins, in accordance with an embodiment of the present invention.

FIG. 6 is a cross-sectional side view along the C-C view identified in FIG. 1 showing a bottom source/drain formed in the cavity below the plurality of vertical fins, in accordance with an embodiment of the present invention.

In one or more embodiments, a bottom source/drain 170 can be formed in the cavity 135 below the plurality of vertical fins 140, where the bottom source/drain 170 can be formed by epitaxial growth from the exposed surfaces of the vertical fins 140, where the vertical fins 140 can be single crystal semiconductor material. In various embodiments, the bottom source/drain 170 can be a semiconductor material that is n-doped or p-doped. An n-doped bottom source/drain 170 can be silicon (Si) with an n-type dopant, and a p-doped bottom source/drain can be silicon-germanium (SiGe) with a p-type dopant. In various embodiments, a bottom source/drain 170 can be formed in each of a plurality of cavities 135 below the plurality of vertical fins 140, wherein each of the cavities and bottom source/drains 170 is offset a distance from the adjacent cavities 135 and bottom source/drains 170.

Figure 7:
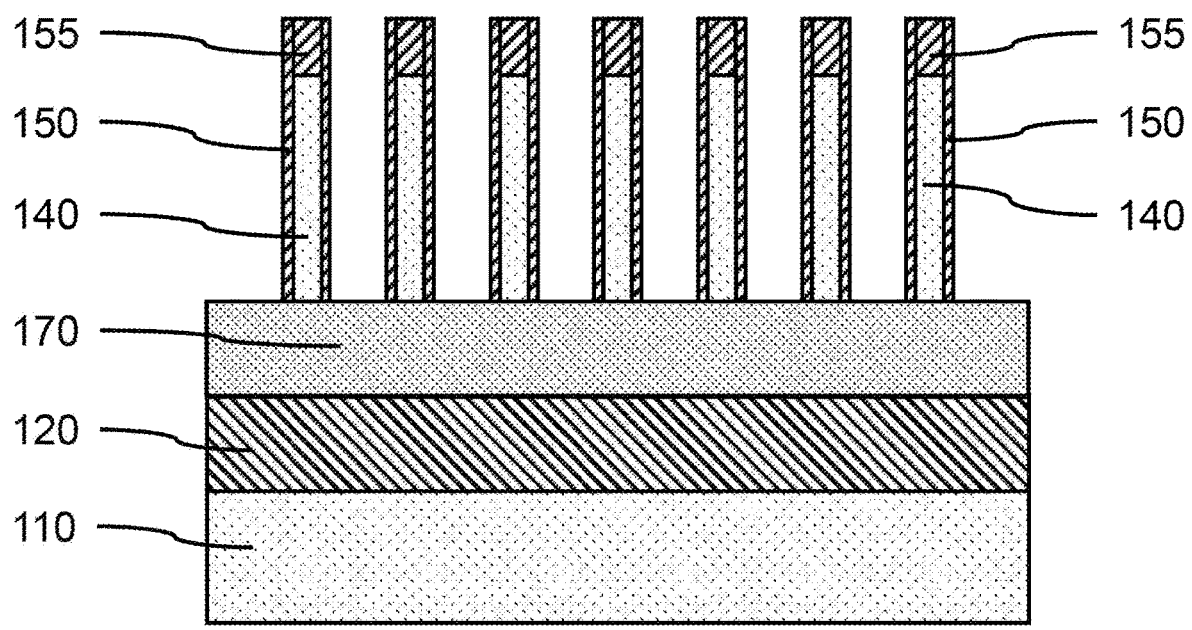
FIG. 7 is a cross-sectional side view along the B-B view identified in FIG. 1 showing a bottom source/drain formed in the cavity below the plurality of vertical fins, in accordance with an embodiment of the present invention.

FIG. 7 is a cross-sectional side view along the B-B view identified in FIG. 1 showing the bottom source/drain formed in the cavity below the plurality of vertical fins, in accordance with an embodiment of the present invention.

In one or more embodiments, the bottom source/drain 170 is formed in the cavity across the section of the lower insulator layer 120 perpendicular to the vertical fins 140. The bottom source/drain 170 can be under and in electrical contact with a central portion of one or more of the vertical fins 140 depending on the length of the opening 165.

Figure 8:
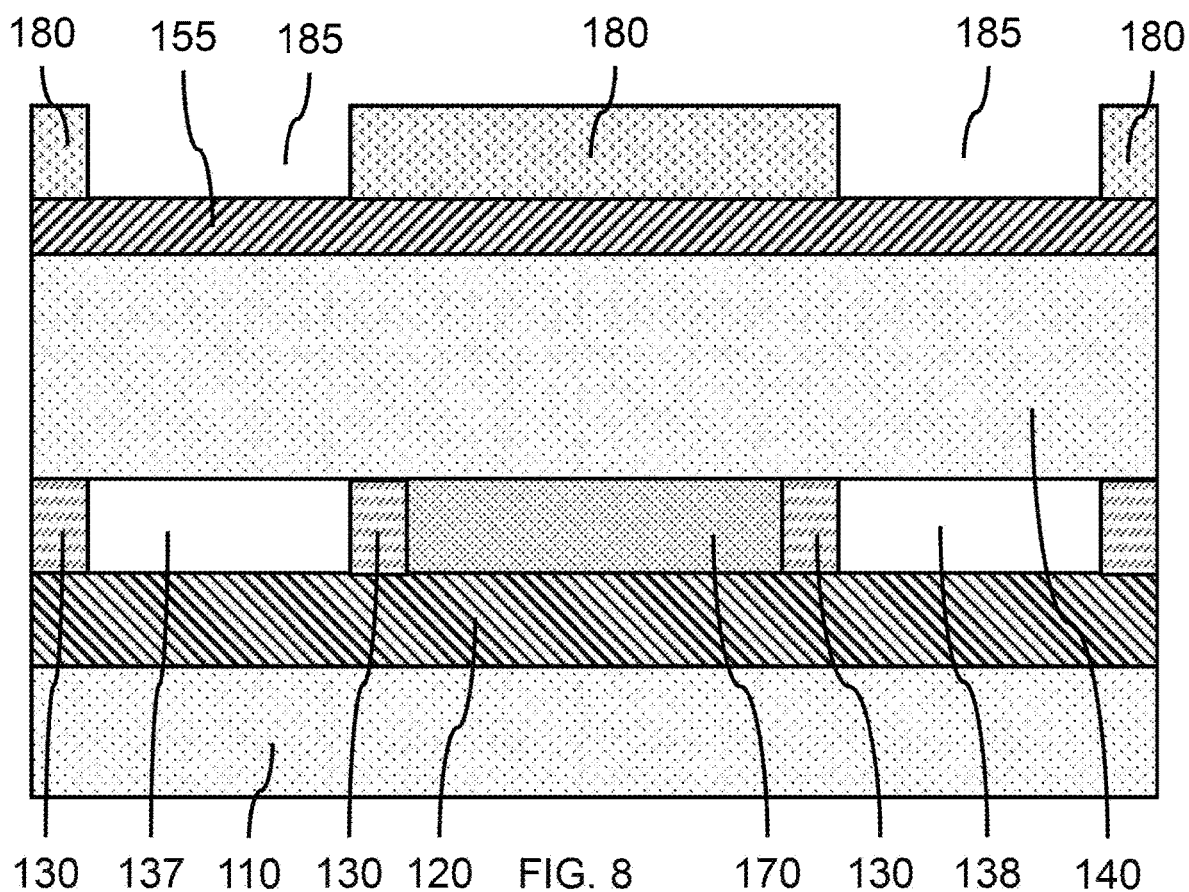
FIG. 8 is a cross-sectional side view along the C-C view identified in FIG. 1 showing a patterned masking layer and a second portion of the substrate removed to form a second and third cavity below each of the plurality of vertical fins, in accordance with an embodiment of the present invention.

FIG. 8 is a cross-sectional side view along the C-C view identified in FIG. 1 showing a patterned masking layer and a second portion of the substrate removed to form a second and third cavity below each of the plurality of vertical fins, in accordance with an embodiment of the present invention.

In one or more embodiments, a masking layer 180 can be formed on the fin templates 155 and protective layer 150, and between the vertical fins 140. The masking layer 180 can be patterned using lithographic processes and etching to form a patterned masking layer with mask openings 185 that expose portions of the fin templates 155 and protective layer 150. The mask openings 185 can be over sections of the vertical fins 140 on opposite sides of the bottom source/drain 170. The mask openings 185 can be laterally offset a distance from the bottom source/drain 170, so an intervening portion of the upper insulator layer 130 remains covered by the masking layer 180.

In one or more embodiments, the mask opening 185 in the masking layer 180 can extend down to the upper insulator layer 130, so a portion of the upper insulator layer 130 is exposed. In one or more embodiments, a portion of the upper insulator layer 130 can be removed using a selective isotropic etch (e.g., wet chemical etch or dry plasma etch) to form a second cavity 137 and third cavity 138 below each of the plurality of vertical fins 140. The exposed portion of the upper insulator layer 130 between the vertical fins 140 can be removed by the selective isotropic etch and undercut the upper insulator layer 130 below the vertical fins 140.

In various embodiments, a portion of the upper insulator layer 130 can remain between the second cavity 137 and the first bottom source/drain 170, and between the third cavity 138 and the first bottom source/drain 170. In various embodiments, the width of the portion of the upper insulator layer 130 remaining between the second cavity 137 and the first bottom source/drain 170, and between the third cavity 138 and the first bottom source/drain 170 can be in a range of about 4 nm to about 25 nm, or about 5 nm to about 15 nm, or about 4 nm to about 10 nm, although other thicknesses are also contemplated.

Figure 9:
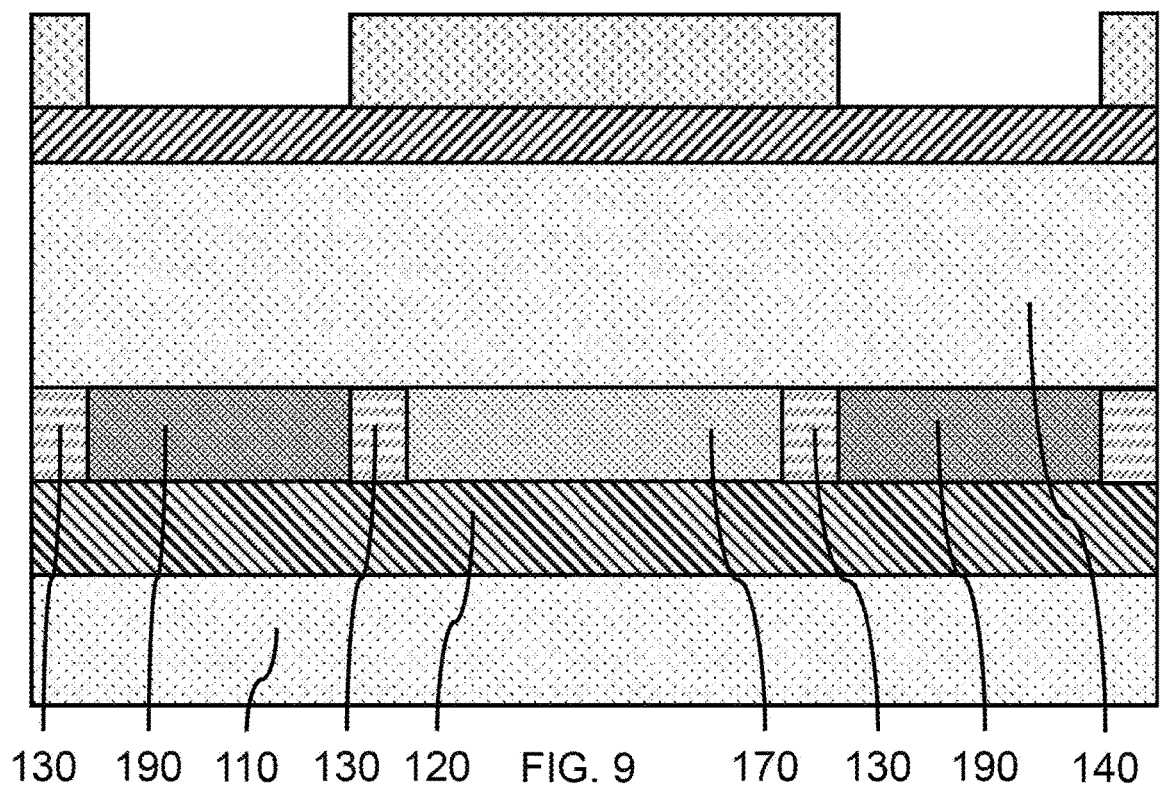
FIG. 9 is a cross-sectional side view along the C-C view identified in FIG. 1 showing a second and third bottom source/drain formed in the second and third cavity below the plurality of vertical fins, in accordance with an embodiment of the present invention.

FIG. 9 is a cross-sectional side view along the C-C view identified in FIG. 1 showing a second and third bottom source/drain formed in the second and third cavity below the plurality of vertical fins, in accordance with an embodiment of the present invention.

In one or more embodiments, a second and third bottom source/drain 190 can be formed in the second and third cavities 137, 138. A plurality of bottom source/drain 190 can be formed in a plurality of cavities that alternate with a plurality of first cavities 135. In various embodiments, the second and third bottom source/drains 190 can be a semi-conductor material that is n-doped or p-doped, where the dopant can be the opposite type from the first bottom source/drain 170.

In various embodiments, an intervening portion of the upper insulator layer 130 can be between the first bottom source/drain 170 and second and third bottom source/drains 190. A portion of the upper insulator layer 130 can remain between each of the alternating first bottom source/drains 170 and adjacent second or third bottom source/drains 190.

Figure 10:
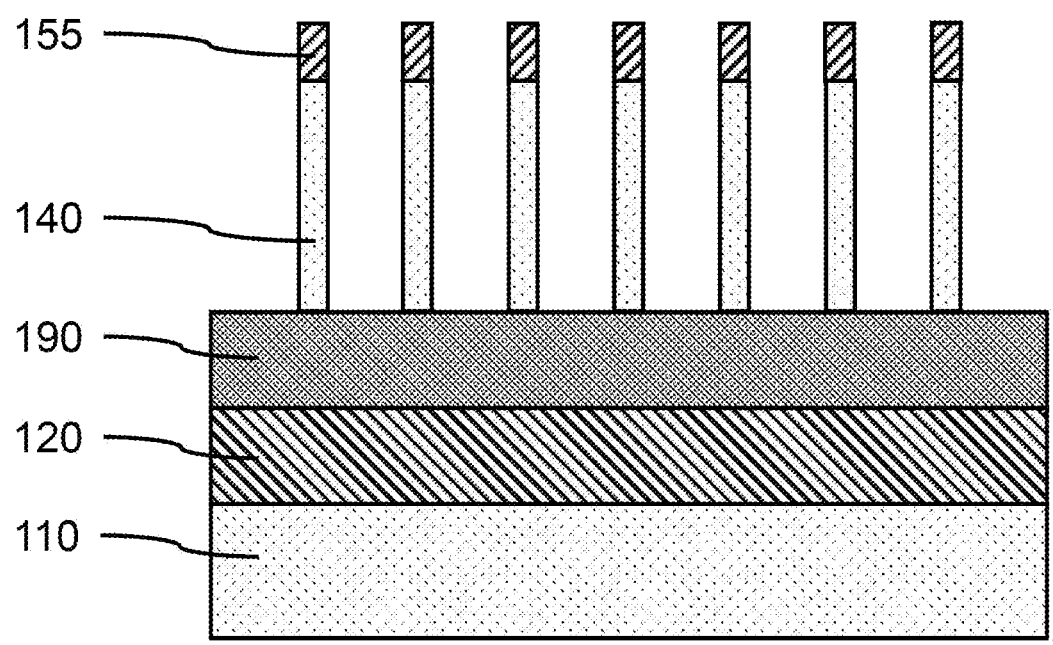
FIG. 10 is a cross-sectional side view along the A-A view identified in FIG. 1 showing the section of the plurality of vertical fins on the second bottom source/drain after removing a portion of the protective layer and the patterned masking layer, in accordance with an embodiment of the present invention.

FIG. 10 is a cross-sectional side view along the A-A view identified in FIG. 1 showing the section of the plurality of vertical fins on the second bottom source/drain after removing a portion of the protective layer and the patterned masking layer, in accordance with an embodiment of the present invention.

In one or more embodiments, the masking layer 180 can be removed using a selective isotropic etch to expose the underlying protective layer 150. The portions of the protective layer 150 on the sidewalls of the vertical fins 140 can be removed using a selective isotropic etch to expose the sidewalls of the vertical fins. The fin template(s) 155 can remain on a top surface of each of the vertical fins after removing the protective layer 150 from the fin sidewalls.

In one or more embodiments, a section of each of the plurality of vertical fins can be on and in electrical contact with the second or third bottom source/drains 190.

Figure 11:
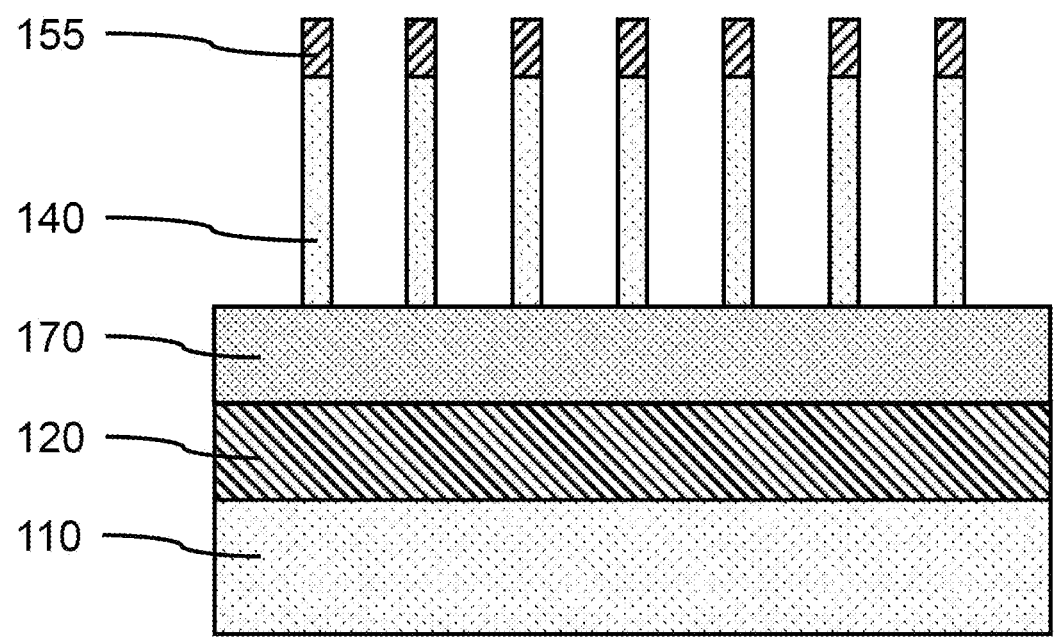
FIG. 11 is a cross-sectional side view along the B-B view identified in FIG. 1 showing the section of the plurality of vertical fins on the first bottom source/drain after removing a portion of the protective layer and the patterned masking layer, in accordance with an embodiment of the present invention.

FIG. 11 is a cross-sectional side view along the B-B view identified in FIG. 1 showing the section of the plurality of vertical fins on the first bottom source/drain after removing a portion of the protective layer and the patterned masking layer, in accordance with an embodiment of the present invention.

In one or more embodiments, a section of each of the plurality of vertical fins 140 can be on and in electrical contact with the first bottom source/drain 170. The section of each of the plurality of vertical fins on the first bottom source/drains 170 can be between the sections of each of the plurality of vertical fins on the second and third bottom source/drains 190.

Figure 12:
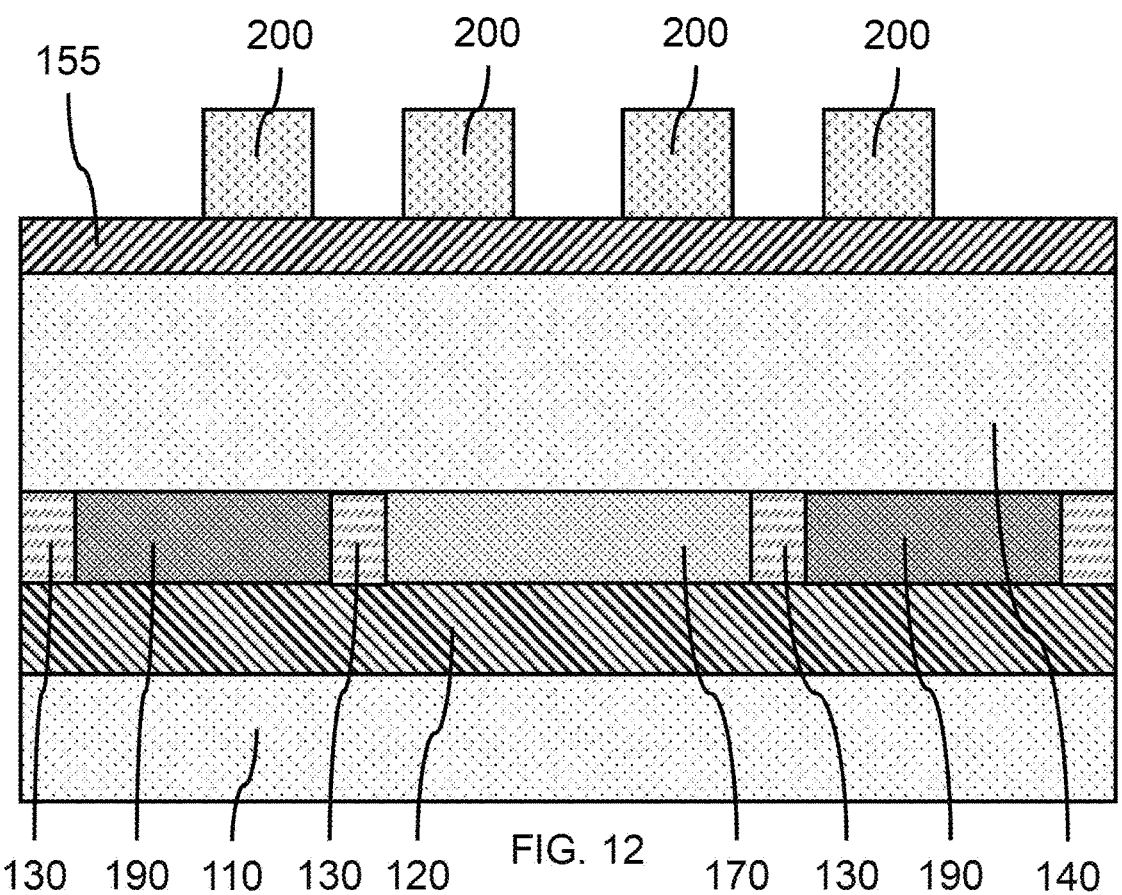
FIG. 12 is a cross-sectional side view along the C-C view identified in FIG. 1 showing a plurality of fin segment templates on the fin template, in accordance with an embodiment of the present invention.

FIG. 12 is a cross-sectional side view along the C-C view identified in FIG. 1 showing a plurality of fin segment templates on the fin template, in accordance with an embodiment of the present invention.

In one or more embodiments, a plurality of fin segment templates 200 can be formed on the fin template(s) 155 on each of the vertical fins 140, where the fin segment templates 200 can be formed by patterning and etching an organic planarization layer (OPL) using lithographic processes. The fin segment templates 200 can be located over sections of the vertical fins 140 intended to remain on the first bottom source/drains 170 and second and third bottom source/drains 190, whereas gaps can be formed over sections of the vertical fins 140 intended to be removed. The gaps can be over the intervening portion of the upper insulator layer 130.

Figure 13:
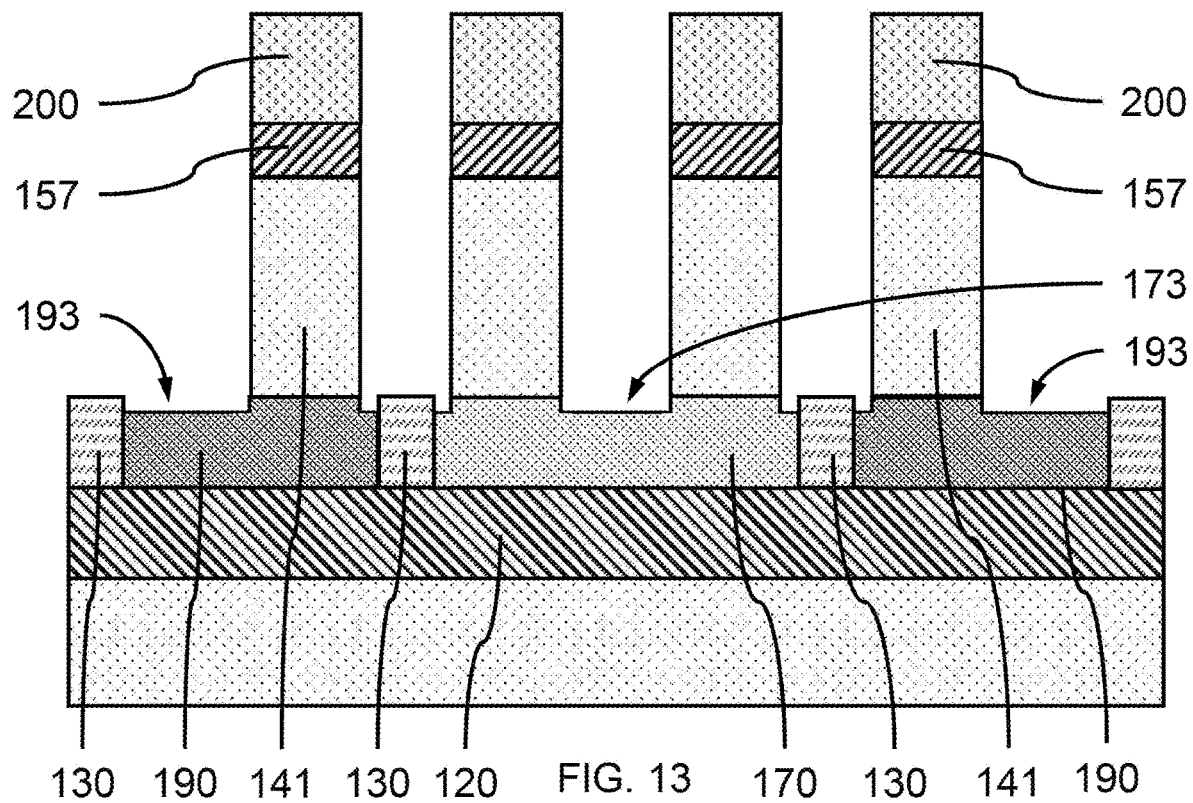
FIG. 13 is a cross-sectional side view along the C-C view identified in FIG. 1 showing the fin template and vertical fin divided into fin segments and fin template segments using the plurality of fin segment templates, in accordance with an embodiment of the present invention.

FIG. 13 is a cross-sectional side view along the C-C view identified in FIG. 1 showing the fin template and vertical fin divided into fin segments and fin template segments using the plurality of fin segment templates, in accordance with an embodiment of the present invention.

In one or more embodiments, portions of the fin template(s) 155 and the vertical fin(s) 140 between the plurality of fin segment templates 200 can be removed using a selective, directional etch, for example, a reactive ion etch (RIE). The exposed portions of the vertical fins 140 can be removed down to the first bottom source/drains 170 and second and third bottom source/drains 190. Removal of portions of the fin template(s) 155 and the vertical fin(s) 140 between the plurality of fin segment templates 200 can form fin template segments 157 on fin segments 141, where adjacent fin template segments 157 and fin segments 141 are separated by a trench.

In various embodiments, the exposed portions of the first bottom source/drains 170 and second and third bottom source/drains 190 can be over-etched to form divots 173, 193 in the first bottom source/drains 170 and second and third bottom source/drains 190 adjacent to the fin segments 141, such that the top surface of the first bottom source/drains 170 and second and third bottom source/drains 190 can be below the bottom of the adjacent fin segment 141. The intervening portion of the upper insulator layer 130 can be exposed between the vertical fins. Divots 173, 193 can be formed in each of the plurality of alternating bottom source/drains 170, 190.

Figure 14:
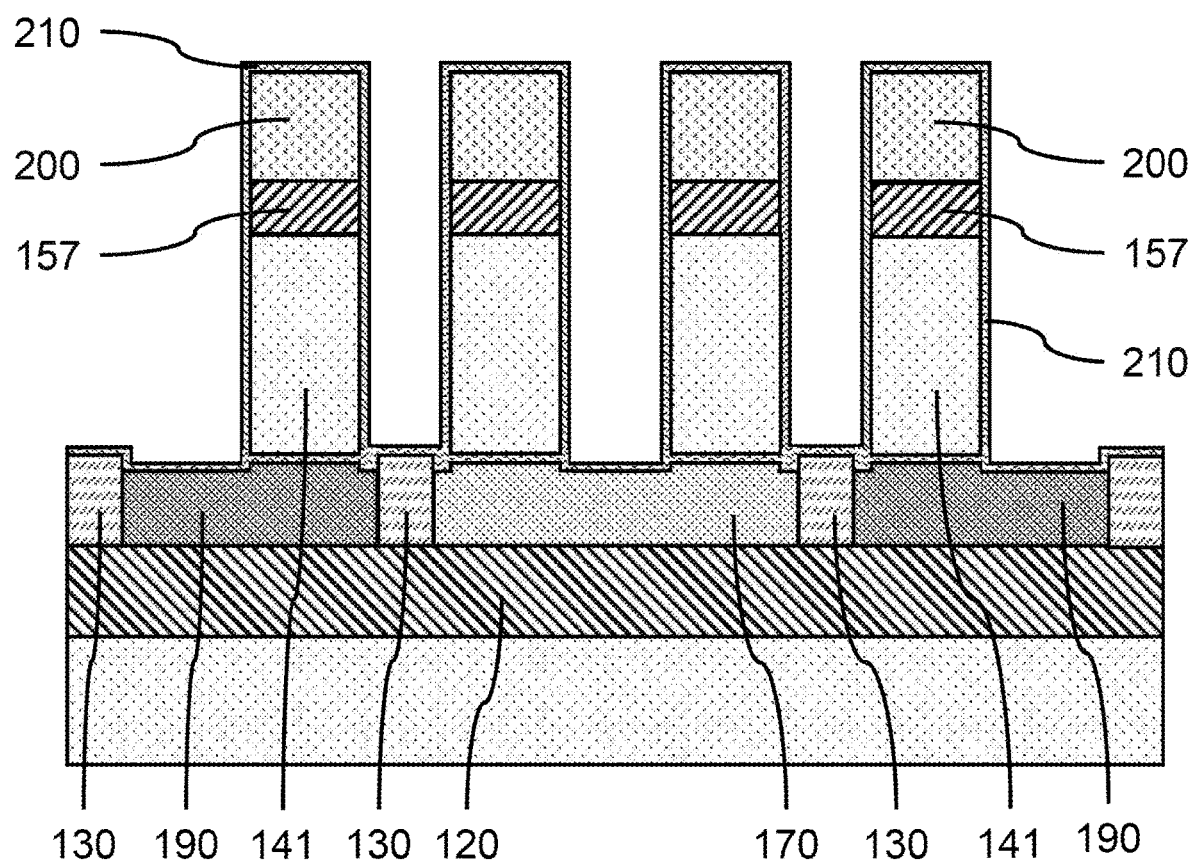
FIG. 14 is a cross-sectional side view along the C-C view identified in FIG. 1 showing a fin liner formed on the fin segments and fin template segments, in accordance with an embodiment of the present invention.

FIG. 14 is a cross-sectional side view along the C-C view identified in FIG. 1 showing a fin liner formed on the fin segments and fin template segments, in accordance with an embodiment of the present invention.

In one or more embodiments, a fin liner 210 can be formed on the fin segments 141 and fin template segments 157, where the fin liner 210 can be formed by a conformal deposition, for example, atomic layer deposition (ALD), plasma enhanced ALD (PEALD), or a combination thereof.

In various embodiments, the fin liner 210 can have a thickness in a range of about 3 nanometers (nm) to about 15 nm, or about 3 nm to about 8 nm, although other thicknesses are also contemplated. The thickness of the fin liner 210 can be less than half (½) the distance between the facing sidewalls or end walls of the fin segments 141, such that the intervening spacer can be etched.

In various embodiments, the fin liner 210 can be an insulating dielectric material, including, but not limited to, silicon oxide (SiO), silicon nitride (SiN), silicon oxynitride (SiON), silicon boro carbonitride (SiBCN), and combinations thereof.

Figure 15:
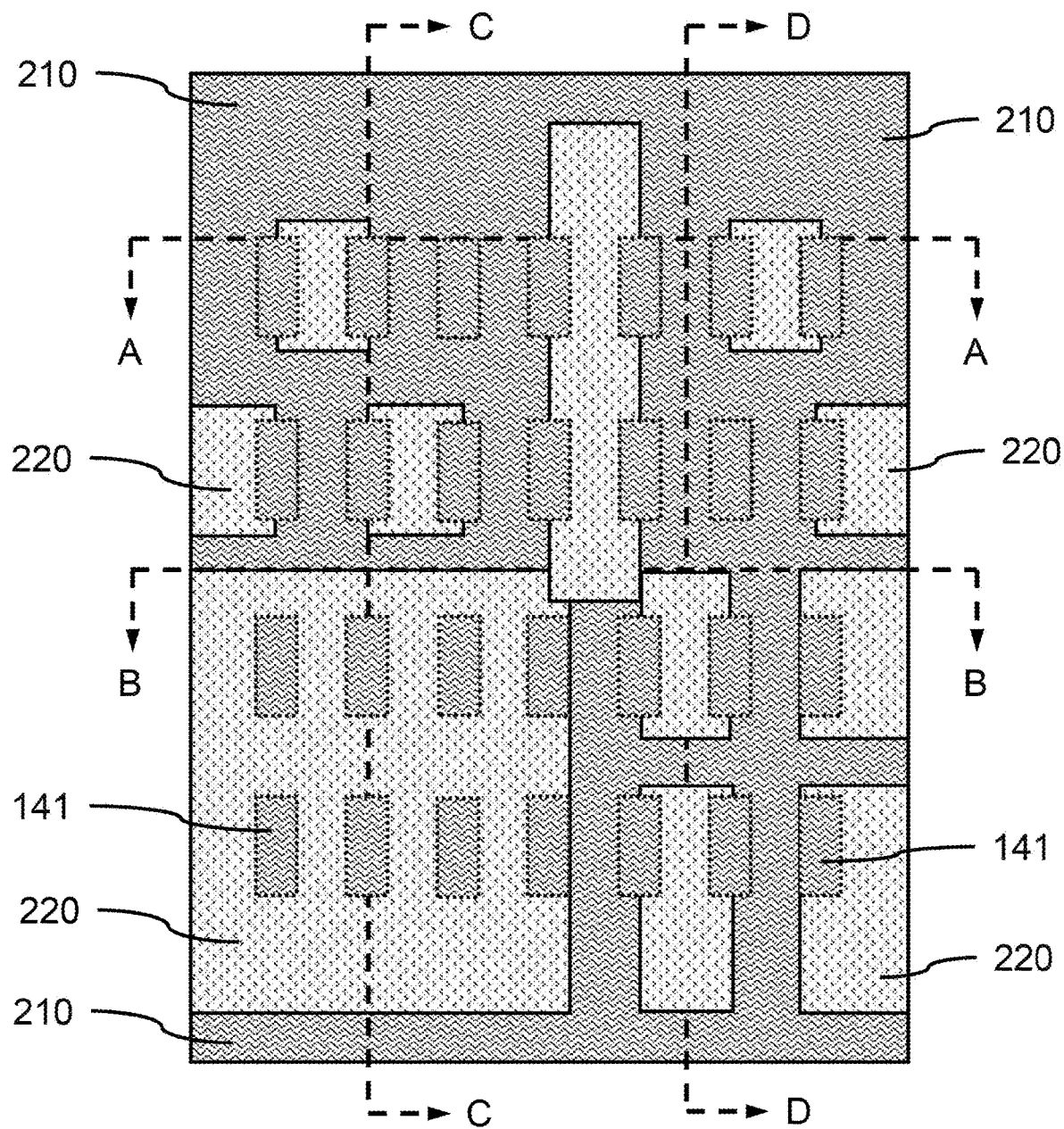
FIG. 15 is a top view showing an arrangement of screening blocks on subsets of the fin segments, in accordance with an embodiment of the present invention.

FIG. 15 is a top view showing an arrangement of screening blocks on subsets of the fin segments, in accordance with an embodiment of the present invention.

In one or more embodiments, an arrangement of screening blocks 220 can be formed on subsets of the fin segments, where the screening blocks can be formed by lithographic processes and etching. In various embodiments, screening blocks 220 can be a tri-layer of a spin-on organic layer (OPL), an antireflection coating (ARC) as a hardmask, and an organic resist that can be patterned by lithography and etching. The subsets of fin segments 141 that can be covered by the screening blocks 220 can be determined by the type and location of the intended device(s) being formed.

Figure 16:
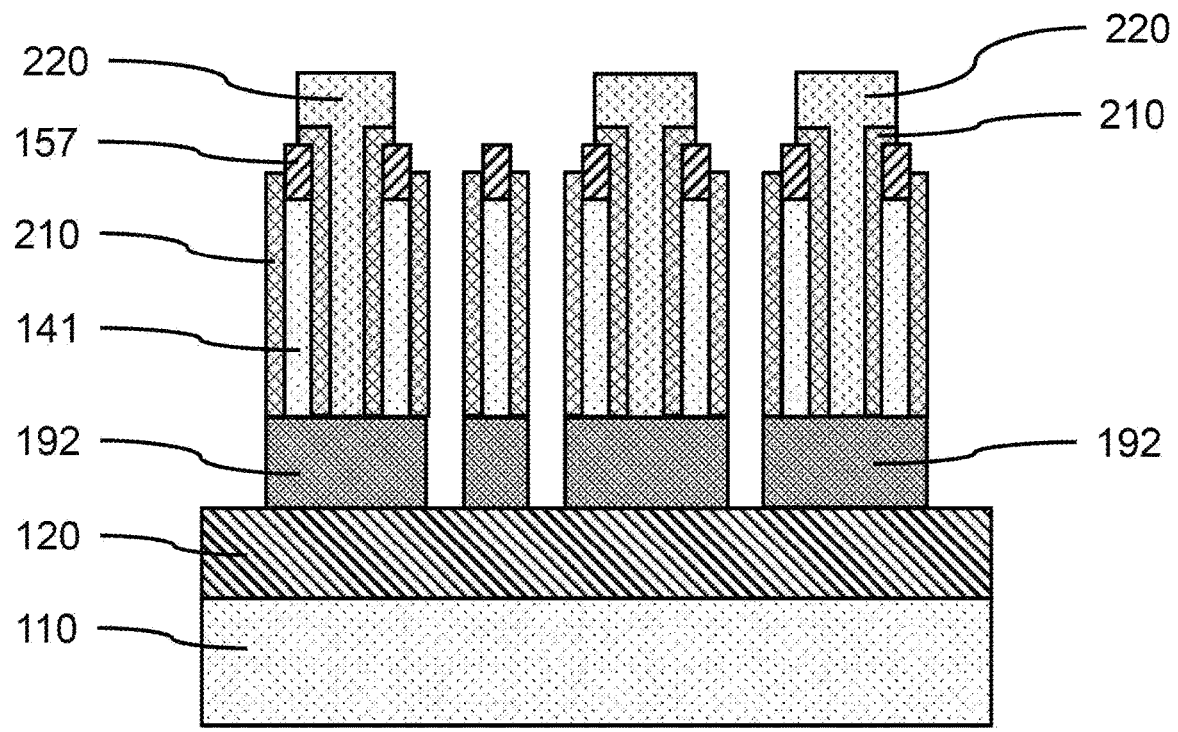
FIG. 16 is a cross-sectional side view along the A-A view identified in FIG. 1 showing the screening blocks on subsets of the fin segments on the second bottom source/drain, in accordance with an embodiment of the present invention.

FIG. 16 is a cross-sectional side view along the A-A view identified in FIG. 1 showing the screening blocks on subsets of the fin segments on the second bottom source/drain, in accordance with an embodiment of the present invention.

In one or more embodiments, the screening blocks 220 on different subsets of the fin segments 141 on the second bottom source/drain 190 can leave a portion of the fin liner 210 exposed. The exposed portions of the fin liner 210 can be removed from the fin segments 141 to expose a portion of the fin template segments 157 and second bottom source/drain 190, where the exposed portions of the fin liner 210 can be removed using a selective, directional etch (e.g., RIE).

In various embodiments, exposed portions of the second bottom source/drains 190 can be removed using a selective, directional etch (e.g., RIE) to form second bottom source/drain regions 192. The second bottom source/drain regions 192 can be underneath different subsets of fin segments 141, and separated from adjacent second bottom source/drain regions 192 by spaces.

Figure 17:
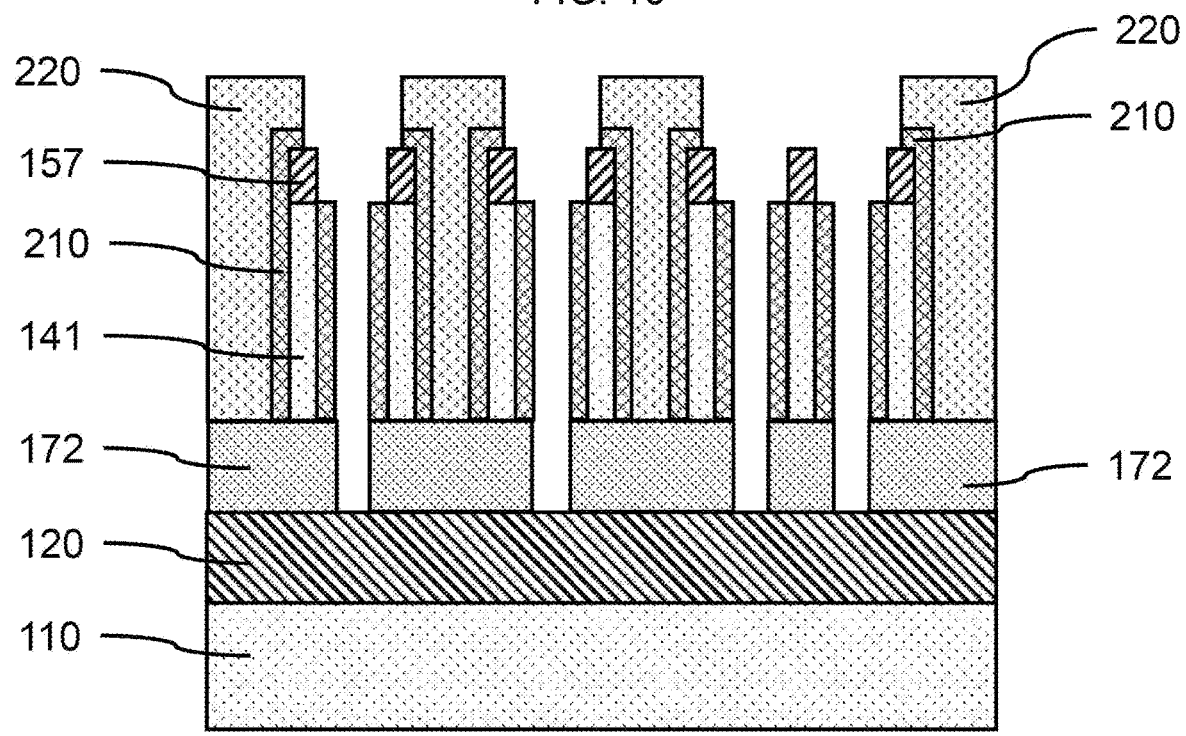
FIG. 17 is a cross-sectional side view along the B-B view identified in FIG. 1 showing the screening blocks on different subsets of the fin segments on the first bottom source/drain, in accordance with an embodiment of the present invention.

FIG. 17 is a cross-sectional side view along the B-B view identified in FIG. 1 showing the screening blocks on different subsets of the fin segments on the first bottom source/drain, in accordance with an embodiment of the present invention.

In one or more embodiments, the screening blocks 220 on different subsets of the fin segments 141 on the first bottom source/drain 170 can leave a portion of the fin liner 210 exposed. The exposed portions of the fin liner 210 can be removed from the fin segments 141 to expose a portion of the fin template segments 157 and first bottom source/drain 170. The exposed portions of the fin liner 210 can be removed using a selective, directional etch (e.g., RIE).

In various embodiments, exposed portions of the first bottom source/drain 170 can be removed using a selective, directional etch (e.g., RIE) to form first bottom source/drain regions 172.

Figure 18:
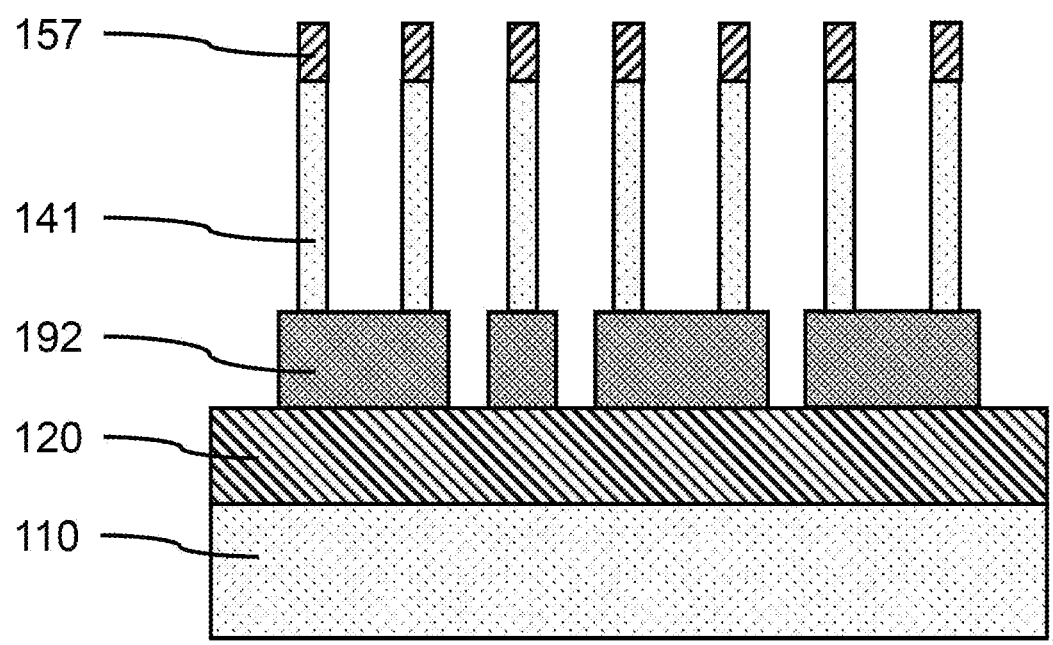
FIG. 18 is a cross-sectional side view along the A-A view identified in FIG. 1 showing the second bottom source/drain patterned to form bottom source/drain regions under subsets of the fin segments, in accordance with an embodiment of the present invention.

FIG. 18 is a cross-sectional side view along the A-A view identified in FIG. 1 showing the second bottom source/drain patterned to form bottom source/drain regions under subsets of the fin segments, in accordance with an embodiment of the present invention.

In one or more embodiments, the screening blocks 220 and fin liner 210 can be selectively removed using selective isotropic etches. Different subsets of the fin segments 141 can be on different second bottom source/drain regions 192 to form different devices.

Figure 19:
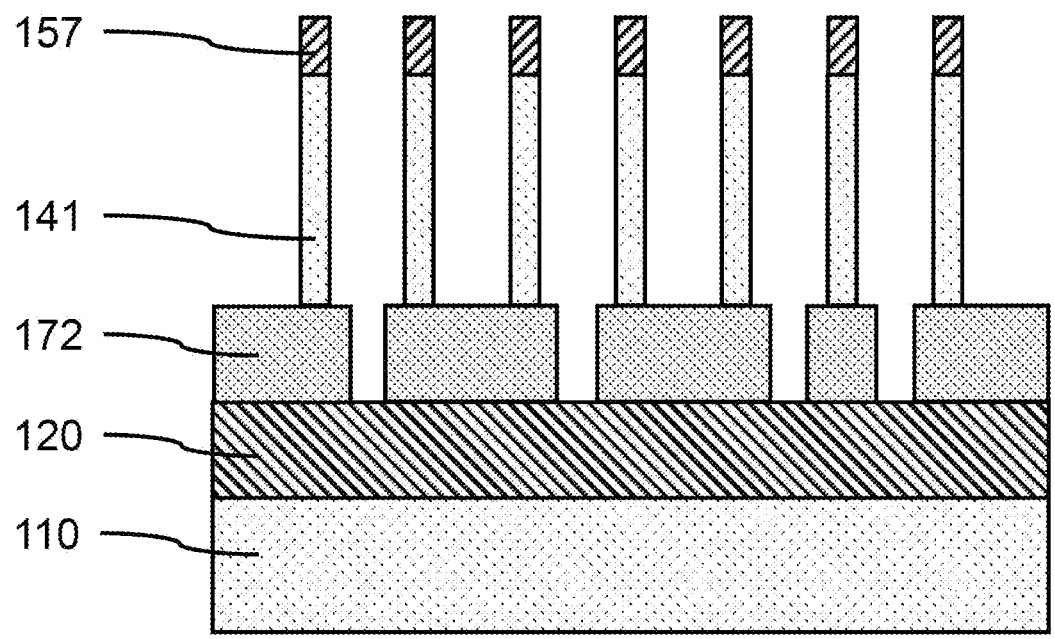
FIG. 19 is a cross-sectional side view along the B-B view identified in FIG. 1 showing the first bottom source/drain patterned to form bottom source/drain regions under different subsets of the fin segments, in accordance with an embodiment of the present invention.

FIG. 19 is a cross-sectional side view along the B-B view identified in FIG. 1 showing the first bottom source/drain patterned to form bottom source/drain regions under different subsets of the fin segments, in accordance with an embodiment of the present invention.

Different subsets of the fin segments 141 can be on different first bottom source/drain regions 172 to form different devices.

Figure 20:
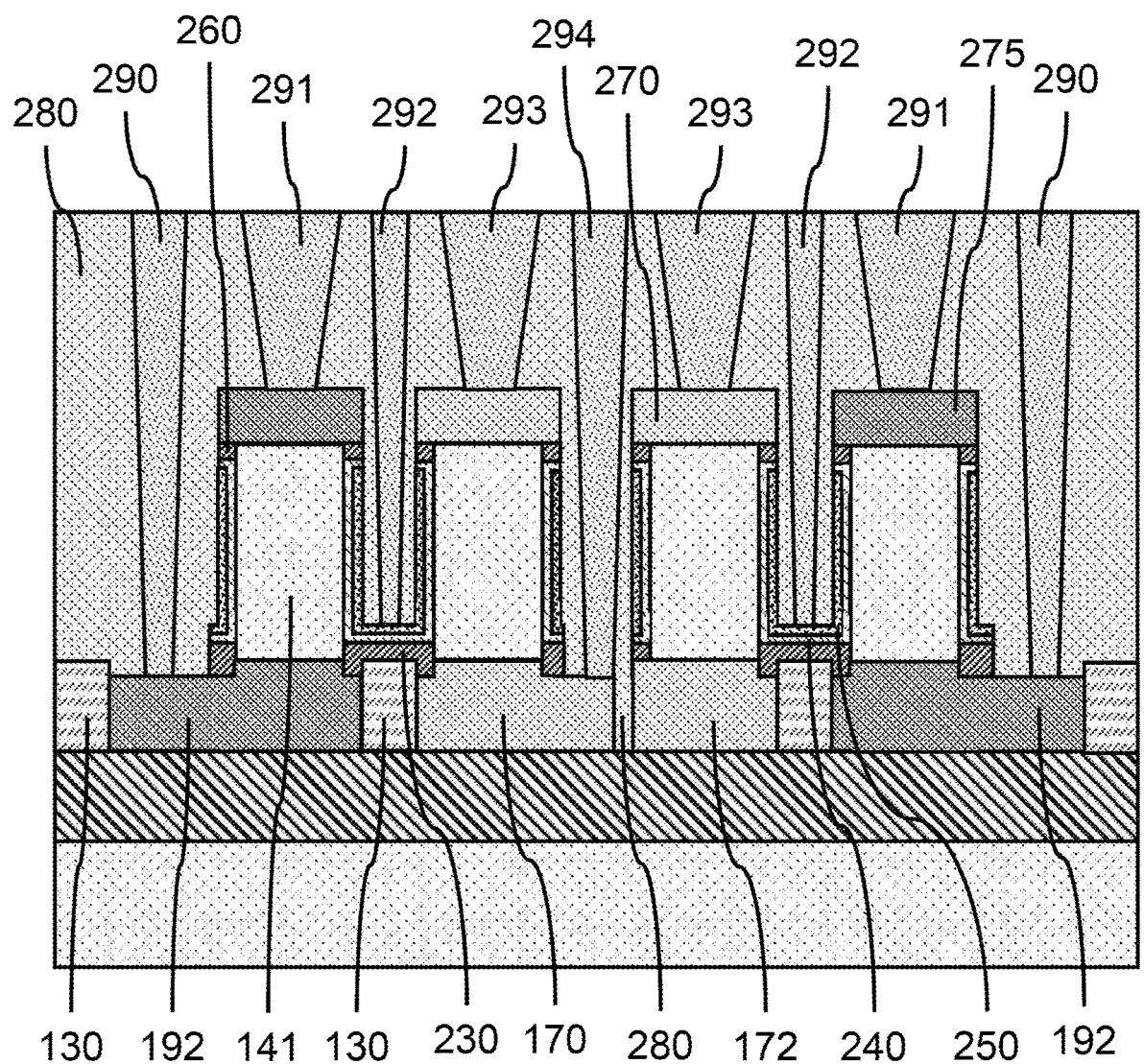
FIG. 20 is a cross-sectional side view along the C-C view identified in FIG. 1 showing gate structures and top source/drains formed on the fin segments, in accordance with an embodiment of the present invention.

FIG. 20 is a cross-sectional side view along the C-C view identified in FIG. 1 showing gate structures and top source/drains formed on the fin segments, in accordance with an embodiment of the present invention.

In one or more embodiments, a bottom spacer layer 230 can be formed on the first bottom source/drain regions 172 and second bottom source/drain regions 192. A gate structure including a gate dielectric layer 240 and a conductive gate layer 250 can be formed on the bottom spacer layer 230 on different subsets of fin segments to form separate devices. A top spacer 260 can be formed on the gate structures. An interlayer dielectric (ILD) layer 280 can be formed on the gate structures, first bottom source/drain regions 172, second bottom source/drain regions 192, and fin segment 141, where the ILD layer 280 can be a blanket deposited dielectric material.

In one or more embodiments, a top source/drain 270, 275 can be formed on each of the fin segments 141, where the top source/drain 270, 275 can have the same dopant type as the first bottom source/drain regions 172 or second bottom source/drain regions 192 beneath the fin segment 141.

In various embodiments, an interlayer dielectric (ILD) layer can be formed on the fin segment 141 and gate structures.

In various embodiments, a top electrical contact 291, 293, can be formed to the top source/drains 270, 275, a first bottom electrical contact 294 can be formed to first bottom source/drain regions 172, a second bottom electrical contact 290 can be formed to second bottom source/drain regions 192, and an electrical gate contact 292 can be formed to gate structures.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A vertical transport field effect transistor (VTFET) device, comprising:
   a plurality of fin segments, wherein at least one fin segment is on a first bottom source/drain region, at least one fin segment is on a second bottom source/drain region, and at least one fin segment is on a third bottom source/drain region, wherein the first bottom source/drain region is n-doped or p-doped and the second bottom source/drain region and third bottom source/drain region have the opposite doping from the first bottom source/drain region;
   a first intervening portion of an upper insulator layer divides the first bottom source/drain region from the second bottom source/drain region, and a second intervening portion of the upper insulator layer divides the first bottom source/drain region from the third bottom source/drain region;

a bottom spacer layer directly contacting a top surface of both the first intervening portion and the second intervening portion;

a gate dielectric layer extending over and in direct contact with an entire upper surface of the bottom spacer layer on the first intervening portion, wherein the bottom spacer layer on the first intervening portion is between the gate dielectric layer and the first intervening portion.

2. The VTFET device of claim 1, wherein the first bottom source/drain region, second bottom source/drain region, and third bottom source/drain region each have a divot.

3. The VTFET device of claim 2, further comprising a lower insulating layer between a substrate and the first intervening portion of the upper insulator layer and between the substrate and the second intervening portion of the upper insulator layer.

4. The VTFET device of claim 2, further comprising a top source/drain on each of the plurality of fin segments.

5. The VTFET device of claim 4, further comprising a conductive gate layer on the gate dielectric layer, wherein the gate dielectric layer is also on each of the plurality of fin segments.

6. The VTFET device of claim 4, further comprising a first bottom electrical contact formed to the first bottom source/drain region, wherein the first bottom electrical contact is located on the divot of the first bottom source/drain region.

7. A vertical transport field effect transistor (VTFET) device, comprising:
a lower insulator layer on a carrier layer;
a first bottom source/drain region, a second bottom source/drain region, and a third bottom source/drain region directly on the lower insulator layer, wherein the first bottom source/drain region is n-doped or p-doped and the second bottom source/drain region and the third bottom source/drain region have the opposite doping from the first bottom source/drain region;
a first intervening portion of an upper insulator layer on the lower insulator layer that divides the first bottom source/drain region from the second bottom source/drain region;
a second intervening portion of the upper insulator layer on the lower insulator layer that divides the first bottom source/drain region from the third bottom source/drain region;
a plurality of fin segments on the first bottom source/drain region;
a plurality of fin segments on the second bottom source/drain region;
a plurality of fin segments on a third bottom source/drain region; and
a bottom spacer layer directly contacting a top surface of both the first intervening portion and the second intervening portion, wherein a portion of the bottom spacer layer extends along a sidewall of the first intervening portion and another portion of the bottom spacer layer extends along a sidewall of the second intervening portion.

8. The VTFET device of claim 7, further comprising a top source/drain on each of the plurality of fin segments.

9. The VTFET device of claim 8, further comprising a gate dielectric layer extending over and in direct contact with an entire upper surface of the bottom spacer layer on the first intervening portion, wherein the bottom spacer layer on the first intervening portion is between the gate dielectric layer and the first intervening portion.

10. The VTFET device of claim 9, further comprising a conductive gate layer on the gate dielectric layer, wherein the gate dielectric layer is also on each of the plurality of fin segments.

11. The VTFET device of claim 10, wherein the first bottom source/drain region, second bottom source/drain region, and third bottom source/drain region each have a divot.

12. The VTFET device of claim 11, wherein at least a portion of the divot in the second bottom source/drain region is between the first intervening portion of the upper insulator layer and one of the plurality of fins on the second bottom source/drain region.

13. The VTFET device of claim 12, further comprising a second bottom electrical contact in electrical contact with the second bottom source/drain region, wherein the second bottom electrical contact is located on a portion of the divot of the second bottom source/drain region.

14. The VTFET device of claim 13, further comprising an electrical gate contact directly over the first intervening portion of the upper insulator layer.

* * * * *